(12) United States Patent
Roeglinger

(10) Patent No.: US 11,907,755 B2
(45) Date of Patent: Feb. 20, 2024

(54) SYSTEM AND METHOD FOR DISTRIBUTED EXECUTION OF A SEQUENCE PROCESSING CHAIN

(71) Applicant: Rohde & Schwarz GmbH & Co. KG, Munich (DE)

(72) Inventor: Sebastian Roeglinger, Pfaffenhofen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 400 days.

(21) Appl. No.: 16/692,760

(22) Filed: Nov. 22, 2019

(65) Prior Publication Data

US 2021/0157637 A1    May 27, 2021

(51) Int. Cl.
| | |
|---|---|
| *G06F 9/48* | (2006.01) |
| *G06F 16/23* | (2019.01) |
| *G06F 9/50* | (2006.01) |
| *G01R 31/317* | (2006.01) |
| *G05B 19/406* | (2006.01) |

(52) U.S. Cl.
CPC ..... *G06F 9/4881* (2013.01); *G01R 31/31718* (2013.01); *G01R 31/31722* (2013.01); *G05B 19/406* (2013.01); *G06F 9/5027* (2013.01); *G06F 16/2379* (2019.01); *G05B 2219/33297* (2013.01); *G06F 2209/503* (2013.01)

(58) Field of Classification Search
CPC .. G06F 9/4881; G06F 16/2379; G06F 9/5027; G06F 2209/503; G06F 9/5072; G01R 31/31718; G01R 31/31722; G05B 19/406; G05B 2219/33297; G06Q 10/06; G06N 20/00

USPC ............................................... 718/104
See application file for complete search history.

(56) References Cited

U.S. PATENT DOCUMENTS

| | | | |
|---|---|---|---|
| 4,797,885 A | * | 1/1989 | Orimo ................. G06F 11/3672 714/38.1 |
| 5,847,955 A | | 12/1998 | Mitchell et al. |

(Continued)

FOREIGN PATENT DOCUMENTS

| | | |
|---|---|---|
| EP | 0973297 A2 | 1/2000 |
| EP | 1461692 A2 | 9/2004 |

(Continued)

OTHER PUBLICATIONS

Abdennadher et al., "A Large Scale Distributed Platform for High Performance Computing", 2005, IEEE, pp. 1-6. (Year: 2005).*

*Primary Examiner* — Kenneth Tang
(74) *Attorney, Agent, or Firm* — DITTHAVONG, STEINER & MLOTKOWSKI

(57) ABSTRACT

A system is provided for distributed execution of a sequence processing chain. The system comprises an interface adapted to set a measurement sequence for a plurality of measurement sites, each comprising a sequence runner. The system further comprises a sequencer repository adapted to be accessed locally from the plurality of measurement sites. Moreover, the system comprises a sequence state manager adapted to receive measurement sequence states from at least one sequence runner and further adapted to distribute the measurement sequence states to other sequence runners via a network. In this context, the measurement sequence states are associated with data and/or results through the sequence processing chain.

17 Claims, 4 Drawing Sheets

(56) References Cited

U.S. PATENT DOCUMENTS

| | | | |
|---|---|---|---|
| 6,397,378 B1 | 5/2002 | Grey et al. | |
| 2003/0083837 A1 | 5/2003 | Dinning et al. | |
| 2003/0083838 A1 | 5/2003 | Barrett et al. | |
| 2003/0083842 A1 | 5/2003 | Miller et al. | |
| 2005/0080583 A1 | 4/2005 | Kolman | |
| 2005/0128992 A1 | 6/2005 | He et al. | |
| 2006/0036392 A1 | 2/2006 | Fay | |
| 2007/0124363 A1* | 5/2007 | Lurie | H04L 41/00 709/202 |
| 2008/0059106 A1 | 3/2008 | Wight et al. | |
| 2008/0243732 A1 | 10/2008 | Cataldo et al. | |
| 2010/0114618 A1* | 5/2010 | Wilcock | G06Q 10/06375 705/348 |
| 2013/0151905 A1 | 6/2013 | Saha et al. | |
| 2013/0152047 A1* | 6/2013 | Moorthi | G06F 11/368 717/124 |
| 2018/0246801 A1* | 8/2018 | Krauss | G06N 20/00 |
| 2019/0065241 A1* | 2/2019 | Wong | G06F 9/5083 |
| 2020/0134207 A1* | 4/2020 | Doshi | G06F 9/44594 |
| 2020/0150178 A1* | 5/2020 | Chen | G01R 31/318364 |

FOREIGN PATENT DOCUMENTS

| | | |
|---|---|---|
| EP | 1530756 B1 | 9/2010 |
| GB | 200621778 | 3/2006 |
| JP | 2011250104 A | 12/2011 |
| WO | 03017093 A2 | 2/2003 |
| WO | 2018106304 A1 | 6/2018 |

\* cited by examiner

SYSTEM AND METHOD FOR DISTRIBUTED EXECUTION OF A SEQUENCE PROCESSING CHAIN

TECHNICAL FIELD

The invention relates to distributed execution of a sequence processing chain, especially for execution of measurement sequences in an asynchronous manner.

BACKGROUND ART

Generally, the execution of measurement sequences in a process chain is performed on a dedicated machine, e.g., on a computer, near the production line. Usually, the computing tasks are run on the measurement devices, which perform pre-arranged measurements on the device under test on the production line. In order to facilitate such dedicated execution as well as on sight computation, expensive test and/or measurement devices are required to be implemented locally. Remote distribution of the sequences and thereby executing the sequences in a decentralized manner effectively utilizes the available resources, e.g., the computational power available to the test site.

For example, the document EP 1 530 756 B1 shows a distributed execution of graphical programs to smart sensors or data acquisition devices. The creation of said graphical programs includes the arrangement of multiple nodes on a display and further interconnecting the nodes in response to user input. Thus, the graphical program can implement a measurement function, e.g., an automation function, a process control function, test and measurement function, which can be executed in a distributed fashion. However, the measurement function does not convey test data and/or their respective test results that can be transmitted, for instance, among multiple measurement instruments in order to execute the process chain in an asynchronous manner.

Accordingly, there is a need to provide a system and a method for distributed execution of a measurement sequence processing chain, particularly in an asynchronous manner in order to facilitate efficient use of local and remote resources.

SUMMARY OF THE INVENTION

According to a first aspect of the invention, a system for distributed execution of a sequence processing chain is provided. The system comprises an interface adapted to set a measurement sequence for a plurality of measurement sites, each comprising a sequence runner. The system further comprises a sequencer repository adapted to be accessed locally from the plurality of measurement sites. Moreover, the system comprises a sequence state manager adapted to receive measurement sequence states from at least one sequence runner and further adapted to distribute the measurement sequence states to other sequence runners via a network. In this context, the measurement sequence states are associated with data and/or results through the sequence processing chain.

Therefore, a decentralized test and measurement system is provided for fast test sequence execution by utilizing multiple computing nodes. The execution of the measurement sequence can be initiated locally, for instance, on a measurement site, and the associated computational tasks can be performed on multiple computing nodes in a distributed fashion via the network. The measurement sequence is associated with a respective status that comprises the measurement data and its results in the chain of processing. As a result, the available resources, e.g., the processing power of multiple remote computing nodes can be utilized even in an asynchronous manner, in order to calculate an intermediate measurement result and to further determine a combined measurement verdict.

According to a first preferred implementation form of said first aspect of the invention, the sequence runners are adapted to compute resources available on measurement instruments in the plurality of measurement sites. Herein, the computational resources include but not limited to computation/measurement time, computation power, memory space for a measurement instrument and/or for a computer.

According to a second preferred implementation form of said first aspect of the invention, the sequence runners are further adapted to compute resources available on remote computing resources either located at the plurality of measurement sites or connected by the network. In this context, a remote computing resource can be, for instance, a computer either located on the measurement site or connected via the network. Furthermore, the remote computing includes all computation tasks that are not covered by the measurement instruments on the measurement sites.

According to a further preferred implementation form of said first aspect of the invention, the sequence runners on the plurality of measurement sites are further adapted to determine whether a step of the sequence processing chain can be executed on non-measurement instruments and therefore conveys the measurement sequence states associated with the data and/or results to the sequence state manager for further execution of the step.

Therefore, a sequence runner on a measurement site advantageously tracks the steps of the ongoing sequence and is able to determine a step or multiple steps that can be executed on non-measurement instruments. Upon reaching to such a step, the sequence runner, by means of the measurement instrument or instruments of the measurement site, sends the output data and its results along with the sequence status to the sequence state manager. At this point, the sequence state manager may distribute the steps or tasks to local and/or remote computing resources for further sequence execution.

According to a further preferred implementation form of said first aspect of the invention, the sequence state manager is further adapted to determine resources available on the measurement instruments and on the remote computing resources and thereby distributes the measurement sequence states associated with the data and/or results to other sequence runners for further execution of the step. In this context, the sequence state manager may consider the computing power of the measurement instruments, remote computing resources available, data rate between the measurement instruments and the remote computing resources, expected data output quantity for each particular sequence step, and/or the pure measurement tasks of any sequence queue for the measurement instrument for efficient processing.

Additionally or alternately, the sequence runners on the measurement sites may distribute the relevant sequences, sequence states, and necessary data to other sequence runners that are able to perform further execution of the sequences. Advantageously, efficient resource allocation is achieved for distributed sequence execution.

According to a further preferred implementation form of said first aspect of the invention, the sequence state manager is further adapted to classify the steps of the sequence processing chain based on their dependency in order to execute the steps either in parallel or in sequence. Hence, the steps or tasks of the sequence processing chain are segmented into sub-sequences, which are classified into those who have no dependencies and can be run in parallel and further into those that must be executed sequentially.

According to a further preferred implementation form of said first aspect of the invention, the sequence state manager is further adapted to allocate different resources for parallel execution of the steps and to allocate subsequent resources for sequential execution of the steps. In the case of parallel execution, different resources are being used for multiple tasks, where the tasks can be executed immediately upon being received by the respective resources. In the case of sequential execution, where the tasks have dependencies, subsequent resources are instructed to wait for the resource executing the preceding task. Advantageously, the sequence execution can be performed asynchronously on remote computers or measurement sites, while the sequence execution can be interrupted if required.

According to a further preferred implementation form of said first aspect of the invention, the sequence state manager is further adapted to determine the steps of the sequence processing chain that are required to be performed by the measurement instruments. Such pure measurement tasks or steps can be, for instance, data acquisition, transmitting modulated signals to the device under test and the like.

According to a further preferred implementation form of said first aspect of the invention, the remote computing resources are on a cloud computing platform and wherein the sequence state manager is further adapted to allocate the steps of the sequence processing chain that are not required to be performed by the measurement instruments to the cloud computing platform. Advantageously, the measurement instruments are limited to pure measurement tasks only, leading to the efficient use of their resources.

According to a further preferred implementation form of said first aspect of the invention, the data and/or results associated with the measurement sequence states are stored in the database of the cloud computing platform. In this context, the data transmitted to cloud can be I/Q data that has been compressed by the measurement sites, e.g., by the instruments of a measurement site. Additionally or alternately, the results can be further transmitted back to the respective measurement instruments for further synthesis. Advantageously, the intermediate measurement result as well as the combined test verdict can be realized remotely, e.g., in the cloud, which significantly reduces the required processing load to individual measurement site.

According to a further preferred implementation form of said first aspect of the invention, the measurement instruments are on a production line with devices under test, where the devices under test are respectively associated with an identification. Additionally, the identification may be associated with some of the measurement results so that if the computation of the results takes longer than the measurement, the device under test can be identified later and therefore appropriate action can be taken.

According to a second aspect of the invention, a method for distributed execution of a sequence processing chain is provided. The method comprises the step of setting a measurement sequence for a plurality of measurement sites, each comprising a sequence runner. The method further comprises the step of receiving measurement sequence states from at least one sequence runner. Moreover, the method comprises the step of distributing the measurement sequence states to other sequence runners via a network. In this regard, the measurement sequence states are associated with data and/or results through the sequence processing chain. Advantageously, distributed execution of a measurement processing chain is facilitated for fast test sequence execution by means of multiple computing nodes.

According to a first preferred implementation form of said second aspect of the invention, the method further comprises the step of computing resources available on measurement instruments in the plurality of measurement sites. Advantageously, on-site computing resources are effectively acknowledged.

According to a second preferred implementation form of said second aspect of the invention, the method further comprises the step of computing resources available on remote computers either located at the plurality of measurement sites or connected by the network. Advantageously, remote computing resources are efficiently incorporated.

According to a further preferred implementation form of said second aspect of the invention, the method further comprises the step of determining whether a step of the sequence processing chain can be executed on non-measurement instruments. In addition to this, the method further comprises the step of determining resources available on the measurement instruments and on the remote computers in order to distribute the measurement sequence states associated with the data and/or results to other sequence runners for further execution of the step. Advantageously, efficient resource allocation is achieved for distributed sequence execution.

According to a further preferred implementation form of said second aspect of the invention, the method further comprises the step of classifying the steps of the sequence processing chain based on their dependency in order to execute the steps either in parallel or in sequence. Advantageously, the steps or tasks of the sequence processing chain are segmented into those who have no dependencies and can be run in parallel and further into those that must be executed sequentially.

According to a further preferred implementation form of said second aspect of the invention, the method further comprises the steps of allocating different resources for parallel execution of the steps and allocating subsequent resources for sequential execution of the steps. Advantageously, the sequence execution can be performed asynchronously on remote computers or measurement sites, while the sequence execution can be interrupted if required.

According to a further preferred implementation form of said second aspect of the invention, the method further comprises the step of determining the steps of the sequence processing chain that are required to be performed by the measurement instruments. Such pure measurement tasks or steps can be, for instance, data acquisition, transmitting modulated signals to the device under test and the like.

According to a further preferred implementation form of said second aspect of the invention, the remote computing resources are on a cloud computing platform. In this context, the method further comprises the step of allocating the steps of the sequence processing chain that are not required to be performed by the measurement instruments to the cloud computing platform. Advantageously, the measurement instruments are limited to pure measurement tasks only, leading to the efficient use of their resources.

According to a further preferred implementation form of said second aspect of the invention, the method further comprises the step of storing the data and/or results associated with the measurement sequence states in the database of the cloud computing platform. Advantageously, the intermediate measurement result as well as the combined test verdict can be realized remotely, e.g., in the cloud, which significantly reduces the required processing load to individual measurement site.

BRIEF DESCRIPTION OF THE DRAWINGS

Exemplary embodiments of the invention are now further explained with respect to the drawings by way of example only, and not for limitation. In the drawings.

DETAILED DESCRIPTION OF PREFERRED EMBODIMENTS

Reference will now be made in detail to the embodiments of the present invention, examples of which are illustrated in the accompanying drawings. However, the following embodiments of the present invention may be variously modified and the range of the present invention is not limited by the following embodiments.

Figure 1:
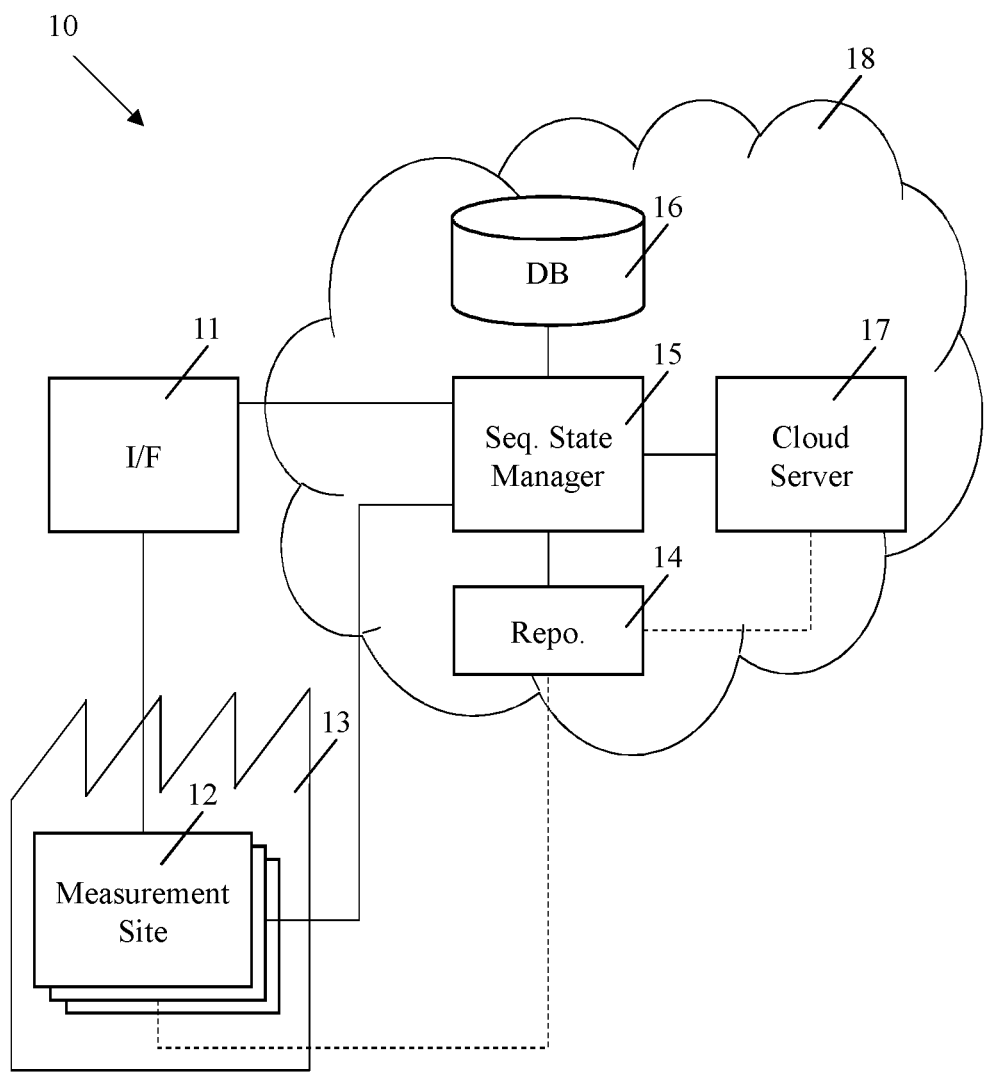
FIG. 1 shows an exemplary embodiment of the system according to the first aspect of the invention in block diagram.

In FIG. 1, an exemplary embodiment of the system 10 according to the first aspect of the invention is illustrated. The system 10 includes an interface 11, for instance, a graphical user interface comprising means for inputting user instructions and further for outputting the measurement results, preferably on a display incorporated therein. The interface 11 can be accessed locally, i.e., the interface 11 can be located at one of the measurement sites 12 within the premises of a production facility 13 or laboratory. Additionally or alternately, the interface 11 can be accessed remotely via a network 18, for instance, via a cloud service. In either case, the interface 11 sets a measurement sequence for the measurement sites 12 that are performing measurements on a device under test, preferably on a production line.

The network 18 or the cloud service facilitates cloud computing platform that comprises a cloud server 17, which represents the remote resources available to the measurement sites 12. Such remote resources can be the computers located at the measurement sites 12 or connected via the network 18. The system 10 further comprises a sequence state manager 15 that is able to communicate with the measurement sites 12, preferably in a wireless manner. The sequence state manager 15 is further able to communicate with the cloud server 17 and vice versa, especially with the remote resources that are facilitated therein. A cloud database 16 is further included within the network 18 where the sequence state manager 15 can store intermediate results and/or process data. The system 10 further comprises a sequencer repository 14, preferably distributed at the cloud service, which can further be accesses locally by the measurement sites 12.

Figure 2:
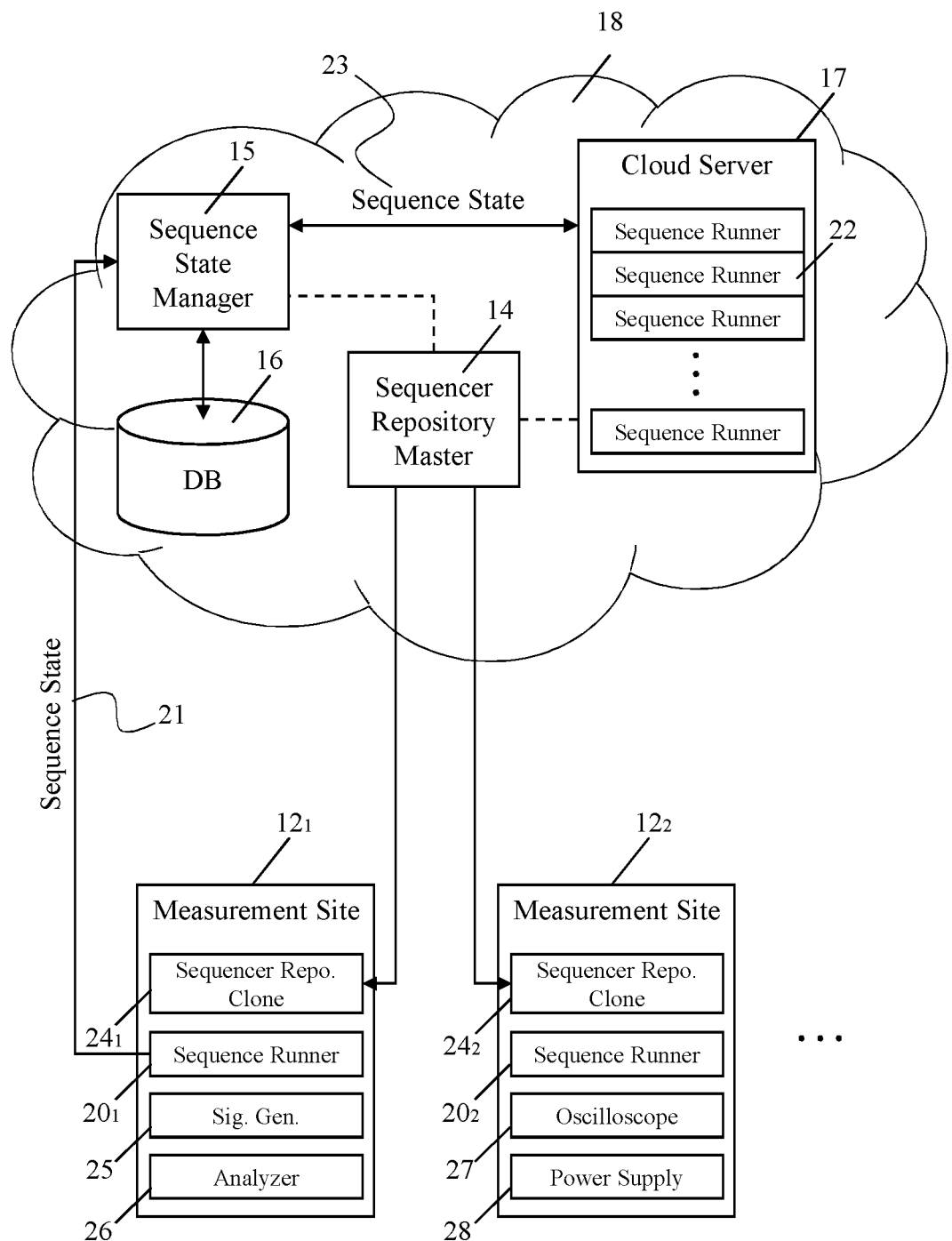
FIG. 2 shows a detailed representation of the system according to the first aspect of the invention.

In FIG. 2, the system 10 is illustrated in greater detail. The measurement sites 12 comprises a different set of measurement instruments for performing a series of tests on the device under test. Especially, the measurement site $12_1$ may comprise signal generator 25 along with signal/spectrum analyzer 26, whereas the measurement site $12_2$ may comprise an oscilloscope 27 fed by a power supply 28. In either scenario, each measurement site $12_1,12_2$ comprises a sequence runner $20_1,20_2$ or sequencer that sends measurement sequence states 21 to the sequence state manager 15. In other words, the sequence runners $20_1,20_2$ facilitate symbiotic operation for the local resources available to the measurement sites $12_1,12_2$ along with the resources provided in the cloud service 18.

The measurement sites $12_1,12_2$ are able to access the sequencer repository 14 locally. In order to do this, the master sequencer repository 14 can be distributed at the cloud service 18 whereas the cloned versions of the sequencer repository $24_1,24_2$ are distributed respectively at the measurement sites $12_1,12_2$. Due to the symbiotic operation, the measurement sites $12_1,12_2$, by means of the sequence runners $20_1,20_2$ send the sequence states 21 to the sequence state manager 15 along with the data and/or results, e.g., the output data/results of the measurements from the instruments 25,26 resp. 27,28. The sequence state manager 15 stores the data/results in the cloud database 16.

In addition, the remote resources or the computers that are either locally or remotely connected to the measurement sites $12_1,12_2$ and are incorporated into the cloud server further comprises respective sequence runners 22. In this regard, the sequence state manager 15 is able to receive sequence states 23 from the cloud server 17 and is further able to send sequence states 23 to the cloud server 17.

Hence, the sequence state manager 15 can distribute sequences, especially the different steps or tasks of the sequence processing chain to different computing nodes. As a result, the computing power in the cloud service 18 can be used to execute measurement sequences so that the sequence execution is no longer bound to a specific measurement site 12 or instruments.

Figure 3:
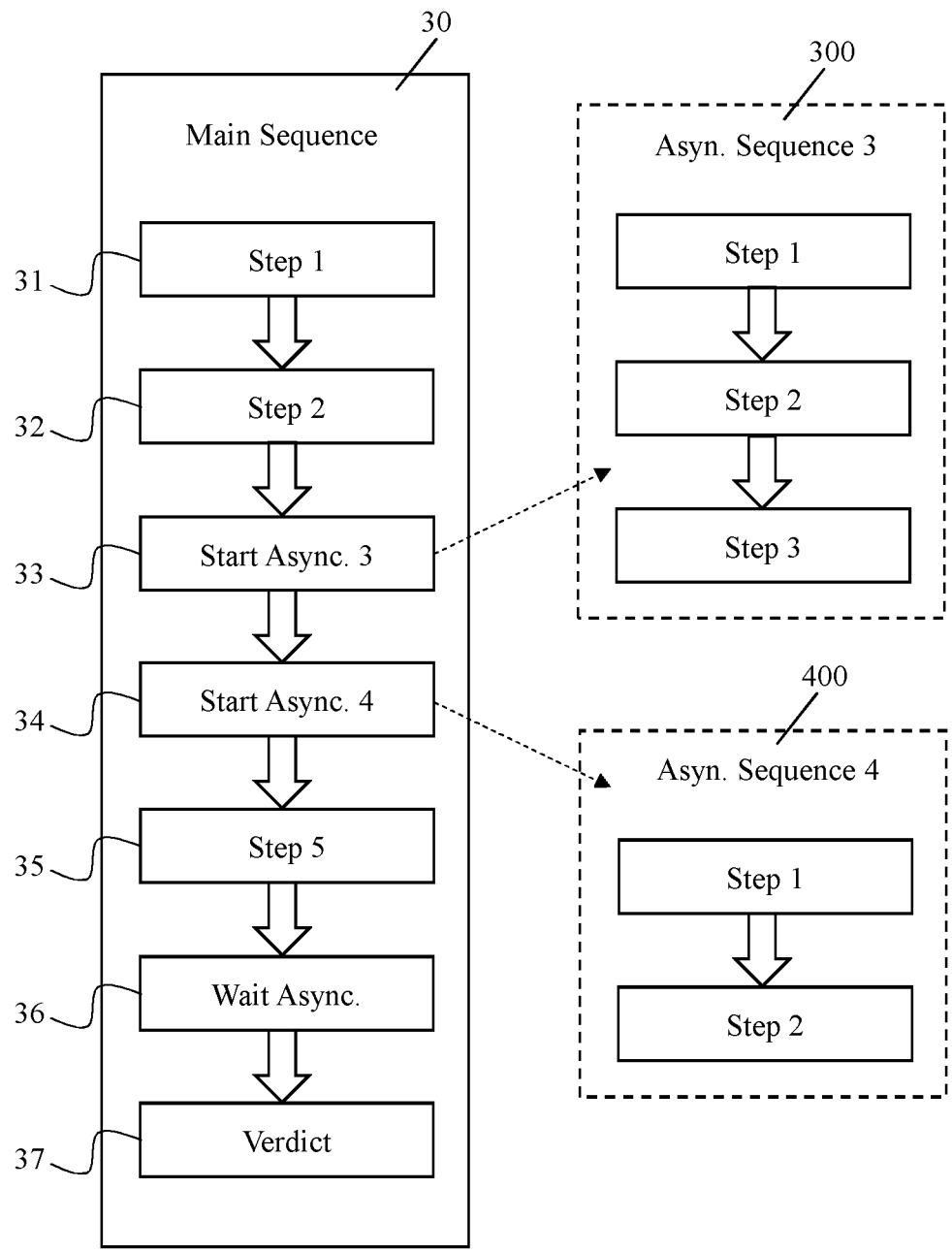
FIG. 3 shows a process flow for parallel execution of sequences by way of an example.

In FIG. 3, a process flow for parallel execution of sequences is illustrated by way of an example. Here, two sub-sequences 300,400 are executed along with a main sequence 30 in parallel. The sequence execution can be initiated locally, for instance, on the measurement sites 12, especially comprising the tasks that are required to be executed on the measurement instruments, e.g., data acquisition. The computational tasks can be executed in cloud, for instance, at the remote computing nodes of different local or remote computers. It is further possible that the measurement verdict can be built in the cloud since the sequence states that are collected by the sequence state manager 15 are associated with the output data and/or results from the measurement sites 12.

For example, the main sequence 30 can be initiated locally and the first task 31 is executed at step 1 followed by the second task 32 at step 2. At this point, the sub-sequence 300 is initiated along the third task 33, for instance, at a remote computing node, and the consecutive steps 1 to 3 of the sub-sequence 300 are executed. After that, during the fourth task 34 of the main sequence 30, a further sub-sequence 400 is initiated, for instance, at a remote computing node, and the consecutive steps 1 to 2 of the sub-sequence 400 are executed. Along the fifth task 35, the execution of the main sequence is continued and any residual steps, e.g., step 5 of the main sequence, are executed.

It is further possible that the main sequence can be interrupted or halted until the execution of the sub-sequences 300,400 are finished, e.g., along the sixth task as illustrated herein. A verdict can be build, for instance, along the seventh task 37 of the main sequence 30, either solely based on the execution of the main sequence 30 or in combination of the main sequence 30 and the sub-sequences 300,400. As a result, asynchronous execution of the measurement sequences is incorporated so that the measurement sequences may contain sub-sequences that can run on other computers or measurement sites in parallel.

It is to be noted that the tasks 31,32,35 of the main sequence as well as the steps of the sub-sequences 300,400 require substantial time to execute the respective steps. Whereas the task for spawning the sub-sequences 300,400 into the main sequence 30, for instance, along the tasks 33,34, takes no substantial time. Thus, the sub-sequences 300,400 can be spawns in the sequence processing chain in real-time in an asynchronous manner. It is preferred that the measurement sequences are version-controlled, for instance, by means of timestamp, in order to provide control over changes during the execution.

Figure 4:
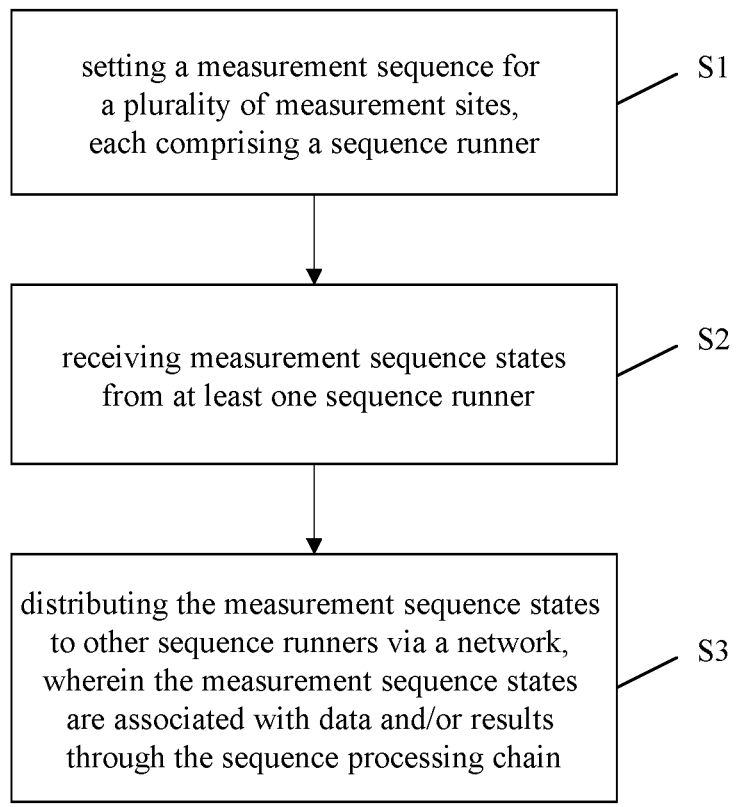
FIG. 4 shows an exemplary embodiment of the method according to the second aspect of the invention.

In FIG. 4, an exemplary embodiment of the method according to the first aspect of the invention is illustrated. In a first step S1, a measurement sequence for a plurality of measurement sites is set, where each measurement site having a sequence runner. In a second step S2, measurement sequence states are received from at least one sequence runner. In a third step S3, the measurement sequence states are distributed to other sequence runners via a network, where the said states are associated with data and/or results through the sequence processing chain.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A system for distributed execution of a sequence processing chain comprising:
    at least one processor; and
        at least one memory including computer program code for one or more programs,
        the at least one memory and the computer program code configured to, with the at least one processor, cause execution of:
            an interface adapted to set a measurement sequence for a plurality of measurement sites, each comprising a sequence runner;
            a sequencer repository adapted to be accessed locally from the plurality of measurement sites by means of cloned versions of the sequencer repository, and
            a sequence state manager adapted to receive measurement sequence states from at least one sequence runner and further adapted to distribute the measurement sequence states to other sequence runners via a network,
                wherein the measurement sequence states comprise measurement data and/or results through the sequence processing chain,
                wherein the sequence runners on the plurality of measurement sites are further adapted to determine whether a step of the sequence processing chain can be executed on local and/or remote computing resources and therefore conveys the measurement sequence states comprising the measurement data and/or results to the sequence state manager for further execution of the step, and
                wherein the sequence state manager is further adapted to determine resources available on the measurement instruments and on the remote computing resources and thereby distributes the measurement sequence states comprising the measurement data and/or results to other sequence runners for further execution of the step.

2. The system according to claim 1,
wherein the sequence runners are adapted to compute resources available on measurement instruments in the plurality of measurement sites.

3. The system according to claim 2,
wherein the measurement instruments are on a production line with devices under test, where the devices under test are respectively associated with an identification.

4. The system according to claim 1,
wherein the sequence runners are further adapted to compute resources available on remote computing resources either located at the plurality of measurement sites or connected by the network.

5. The system according to claim 1,
wherein the sequence state manager is further adapted to classify the steps of the sequence processing chain based on their dependency in order to execute the steps either in parallel or in sequence.

6. The system according to claim 5,
wherein the sequence state manager is further adapted to allocate different resources for parallel execution of the steps and to allocate subsequent resources for sequential execution of the steps.

7. The system according to claim 1,
wherein the sequence state manager is further adapted to determine the steps of the sequence processing chain that are required to be performed by the measurement instruments.

8. The system according to claim 7,
wherein the remote computing resources are on a cloud computing platform and wherein the sequence state manager is further adapted to allocate the steps of the sequence processing chain that are not required to be performed by the measurement instruments to the cloud computing platform.

9. The system according to claim 7,
wherein the measurement data and/or results corresponding to the measurement sequence states are stored in the database of the cloud computing platform.

10. A method for distributed execution of a sequence processing chain comprising the steps of:

setting a measurement sequence for a plurality of measurement sites, each comprising a sequence runner;

accessing a sequencer repository locally from the plurality of measurement sites by means of cloned versions of the sequencer repository;

receiving measurement sequence states from at least one sequence runner, and distributing the measurement sequence states to other sequence runners via a network, wherein the measurement sequence states comprise measurement data and/or results through the sequence processing chain;

determining whether a step of the sequence processing chain can be executed on local and/or remote computers; and determining resources available on the measurement instruments and on the remote computers in order to distribute the measurement sequence states comprising the measurement data and/or results to other sequence runners for further execution of the step.

11. The method according to claim 10,
wherein the method further comprises the step of computing resources available on measurement instruments in the plurality of measurement sites.

12. The method according to claim 11,
wherein the method further comprises the step of determining the steps of the sequence processing chain that are required to be performed by the measurement instruments.

13. The method according to claim 10,
wherein the method further comprises the step of computing resources available on remote computers either located at the plurality of measurement sites or connected by the network.

14. The method according to claim 10,
wherein the method further comprises the step of classifying the steps of the sequence processing chain based on their dependency in order to execute the steps either in parallel or in sequence.

15. The method according to claim 14,
wherein the method further comprises the steps of:
allocating different resources for parallel execution of the steps, and
allocating subsequent resources for sequential execution of the steps.

16. The method according to claim 10,
wherein the remote computing resources are on a cloud computing platform and wherein the method further comprises the step of allocating the steps of the sequence processing chain that are not required to be performed by the measurement instruments to the cloud computing platform.

17. The method according to claim 16,
wherein the method further comprises the step of storing the measurement data and/or results corresponding to the measurement sequence states in the database of the cloud computing platform.

\* \* \* \* \*